United States Patent
Balakrishnan et al.

(10) Patent No.: US 9,559,013 B1
(45) Date of Patent: Jan. 31, 2017

(54) STACKED NANOWIRE SEMICONDUCTOR DEVICE

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/948,441

(22) Filed: Nov. 23, 2015

(51) Int. Cl.
*H01L 29/78* (2006.01)
*H01L 21/8238* (2006.01)
(Continued)

(52) U.S. Cl.
CPC .......... *H01L 21/823814* (2013.01); *H01L 21/823807* (2013.01); *H01L 21/84* (2013.01); *H01L 27/092* (2013.01); *H01L 27/1203* (2013.01); *H01L 29/0673* (2013.01); *H01L 29/161* (2013.01); *H01L 29/165* (2013.01); *H01L 29/1608* (2013.01); *H01L 29/42392* (2013.01);
(Continued)

(58) Field of Classification Search
CPC .......... H01L 21/823814; H01L 29/78618; H01L 29/161; H01L 29/0673; H01L 29/42392; H01L 27/1203; H01L 21/84; H01L 29/165; H01L 27/092; H01L 29/78696; H01L 29/7848; H01L 21/823807; H01L 29/1608
See application file for complete search history.

(56) References Cited

U.S. PATENT DOCUMENTS

| | | | |
|---|---|---|---|
| 5,006,913 A | 4/1991 | Sugahara et al. | |
| 6,808,971 B2 | 10/2004 | Bhattacharyya | |
| 6,821,826 B1 | 11/2004 | Chan et al. | |
| 6,882,010 B2 | 4/2005 | Bhattacharyya | |
| 8,779,495 B2 | 7/2014 | Happ et al. | |
| 9,318,553 B1* | 4/2016 | Cheng | H01L 29/0673 |
| 2005/0239242 A1* | 10/2005 | Zhu | H01L 21/845 438/199 |
| 2012/0138886 A1* | 6/2012 | Kuhn | B82Y 10/00 257/9 |
| 2015/0187764 A1 | 7/2015 | Guo et al. | |

FOREIGN PATENT DOCUMENTS

TW 496292 B 8/2015

OTHER PUBLICATIONS

Wu et al.; A Three-Dimensional Stacked Fin-CMOS Technology for High-Density ULSI Circuits; 1998 IEEE Transactions on Electron Devices, vol. 52, No. 9, Sep. 2005; 6 pages.
(Continued)

*Primary Examiner* — Jarrett Stark
(74) *Attorney, Agent, or Firm* — Cantor Colburn LLP; Steven Meyers

(57) ABSTRACT

A semiconductor device a first epitaxially grown source/drain region comprising a first material arranged on a first fin, a second epitaxially grown source/drain region comprising the first material arranged on the second fin, the second epitaxially grown source/drain region arranged above the first epitaxially grown source/drain region, a third epitaxially grown source/drain region comprising the first material arranged on a second fin, a fourth epitaxially grown source/drain region comprising a second material arranged on the second fin, the fourth epitaxially grown source/drain region arranged above the third epitaxially grown source/drain region, and a gate stack arranged over a channel region of the first fin and a channel region of the second fin.

7 Claims, 22 Drawing Sheets

(51) Int. Cl.
| | |
|---|---|
| *H01L 29/06* | (2006.01) |
| *H01L 29/423* | (2006.01) |
| *H01L 29/786* | (2006.01) |
| *H01L 29/161* | (2006.01) |
| *H01L 29/16* | (2006.01) |
| *H01L 29/165* | (2006.01) |
| *H01L 27/092* | (2006.01) |
| *H01L 27/12* | (2006.01) |
| *H01L 21/84* | (2006.01) |

(52) U.S. Cl.
CPC .... *H01L 29/7848* (2013.01); *H01L 29/78618* (2013.01); *H01L 29/78696* (2013.01)

(56) References Cited

OTHER PUBLICATIONS

Wu et al.; Stacked 3-D Fin-CMOS Technology; IEEE Electron Device Letters, vol. 26, No. 6, Jun. 2005; pp. 416-418.
Karthik Balakrishnan, et al., "Stacked Nanowire Semiconductor Device", U.S. Appl. No. 15/168,367, filed May 31, 2016.
List of IBM Patents or Patent Applications Treated as Related; (Appendix P), Filed Jun. 14, 2016, 2 pages.

\* cited by examiner

STACKED NANOWIRE SEMICONDUCTOR DEVICE

BACKGROUND

The present invention relates to semiconductor devices, and more specifically, to nanowire devices that are arranged in a stacked configuration.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

Nanowire field effect transistor (FET) devices are gate all around devices that include a nanowire channel region with gate material arranged around the nanowire channel. Fin-FET devices are multi-gate devices with fins formed on a substrate and a gate stack arranged over a channel region of the fin.

SUMMARY

According to an embodiment of the present invention, a method for fabricating semiconductor devices comprises forming a substrate having a first insulator layer, a first semiconductor layer arranged on the first insulator layer, a second insulator layer arranged on the first semiconductor layer, and a second semiconductor layer arranged on the second insulator layer, etching to form a first fin and a second fin each fin comprising a portion of the first semiconductor layer, the second insulator layer, and the second semiconductor layer, forming a sacrificial gate stack over a channel region of the first fin and the second fin, epitaxially growing a first source/drain region on an exposed portion of the first semiconductor layer of the first fin, growing a second source/drain region on an exposed portion of the first semiconductor layer of the second fin, growing a third source/drain region on an exposed portion of the second semiconductor layer of the first fin, and growing a fourth source/drain region on an exposed portion of the second semiconductor layer of the second fin, depositing an insulator layer over the source/drain regions, removing a portion of the insulator layer to expose the fourth source/drain region, removing the fourth source/drain region to expose a portion of the second semiconductor layer of the second fin, and epitaxially growing a fifth source/drain region on the exposed portion of the second semiconductor layer of the second fin, the fifth source/drain region formed from a different material than the first source/drain region.

According to an embodiment of the present invention, a method for fabricating semiconductor devices, the method comprises forming a substrate having a first insulator layer, a first semiconductor layer arranged on the first insulator layer, a second insulator layer arranged on the first semiconductor layer, and a second semiconductor layer arranged on the second insulator layer, etching to form a first fin and a second fin each fin comprising a portion of the first semiconductor layer, the second insulator layer, and the second semiconductor layer, forming a sacrificial gate stack over a channel region of the first fin and the second fin, epitaxially growing a first source/drain region on an exposed portion of the first semiconductor layer of the first fin, growing a second source/drain region on an exposed portion of the first semiconductor layer of the second fin, growing a third source/drain region on an exposed portion of the second semiconductor layer of the first fin, and growing a fourth source/drain region on an exposed portion of the second semiconductor layer of the second fin, depositing an insulator layer over the source/drain regions, removing a portion of the insulator layer to expose the third source/drain region and the fourth source/drain region, removing the third source/drain region to expose a portion of the second semiconductor layer of the first fin and removing the fourth source/drain region to expose a portion of the second semiconductor layer of the second fin, and epitaxially growing a fifth source/drain region on the exposed portion of the second semiconductor layer of the first fin, and epitaxially growing a sixth source/drain region on the exposed portion of the second semiconductor layer of the second fin, the fifth source/drain region and sixth source/drain region formed from a different material than the first source/drain region, patterning a mask over the sixth source/drain region, etching to remove the fifth source/drain region and expose the second semiconductor layer of the first fin and the first source/drain region, and epitaxially growing a seventh source/drain region on exposed portions of the second semiconductor layer of the first fin.

According to another embodiment of the present invention, a semiconductor device a first epitaxially grown source/drain region comprising a first material arranged on a first fin, a second epitaxially grown source/drain region comprising the first material arranged on the second fin, the second epitaxially grown source/drain region arranged above the first epitaxially grown source/drain region, a third epitaxially grown source/drain region comprising the first material arranged on a second fin, a fourth epitaxially grown source/drain region comprising a second material arranged on the second fin, the fourth epitaxially grown source/drain region arranged above the third epitaxially grown source/drain region, and a gate stack arranged over a channel region of the first fin and a channel region of the second fin.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-9B illustrate a first exemplary method for fabricating a FET device:

FIG. 1 illustrates a side view of a wafer that includes a substrate.

FIG. 9B illustrates a top view following the deposition of the additional IDL layer material.

FIGS. 12A-19B illustrate an alternate exemplary method for fabricating FET devices having stacked source/drain regions:

FIG. 12A illustrates a cutaway view along the line A-A of FIG. 12B.

13B illustrates a top view of the exposed source/drain regions and the sacrificial gate stacks.

Figure 14A:
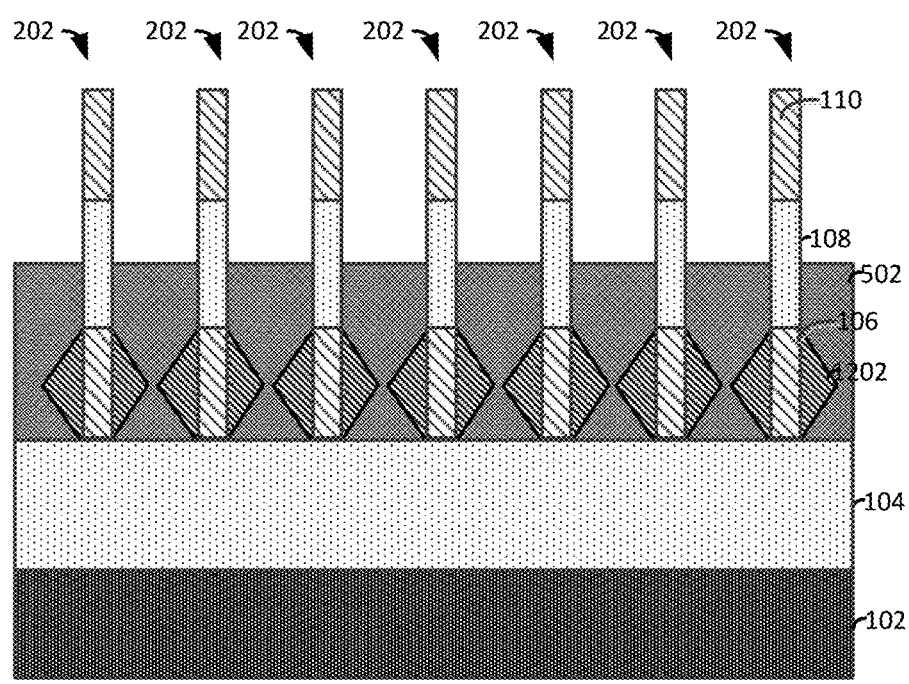
Figure 14B:
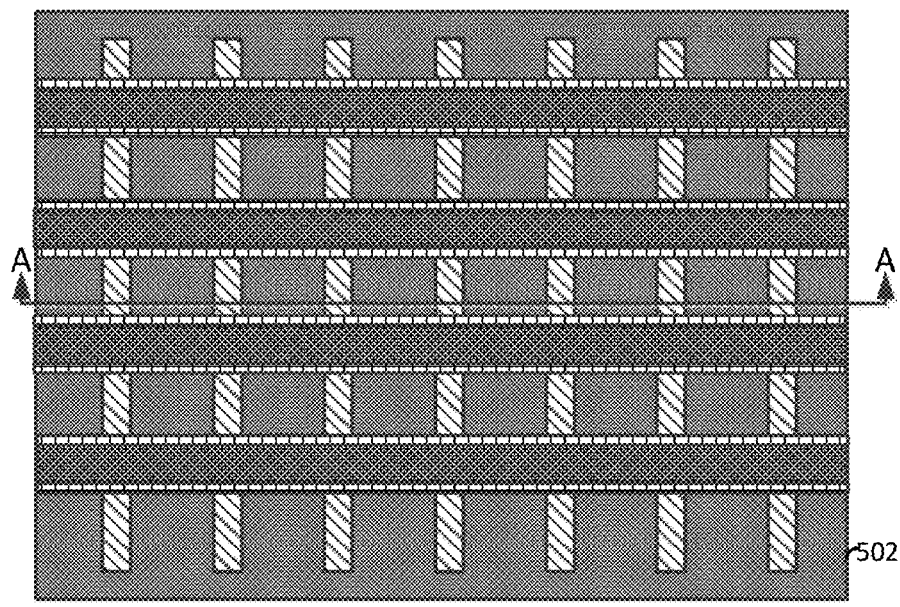

FIG. 14A illustrates a cutaway view along the line A-A of FIG. 14B following a selective etching process.

FIG. 14B illustrates a top view of the exposed portions of the fins.

Figure 15A:
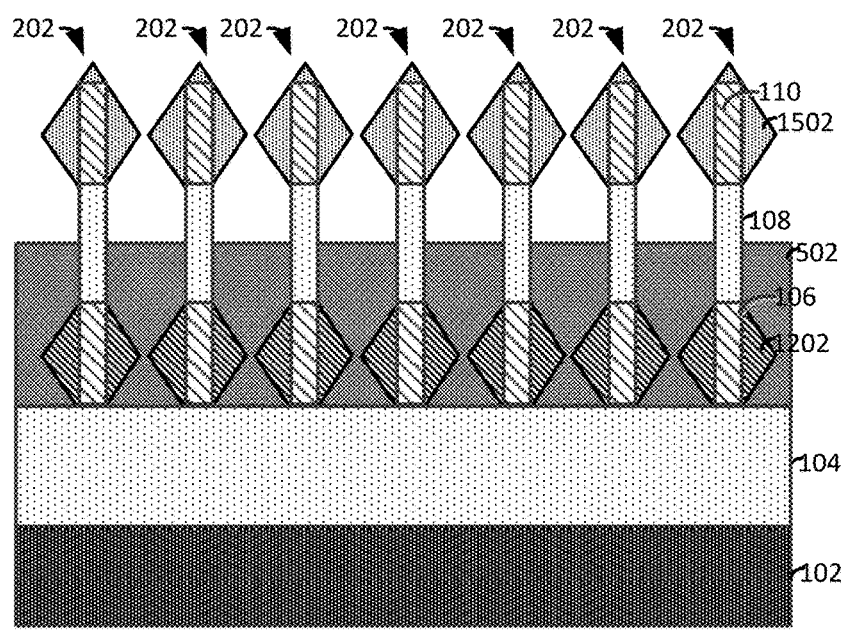
Figure 15B:
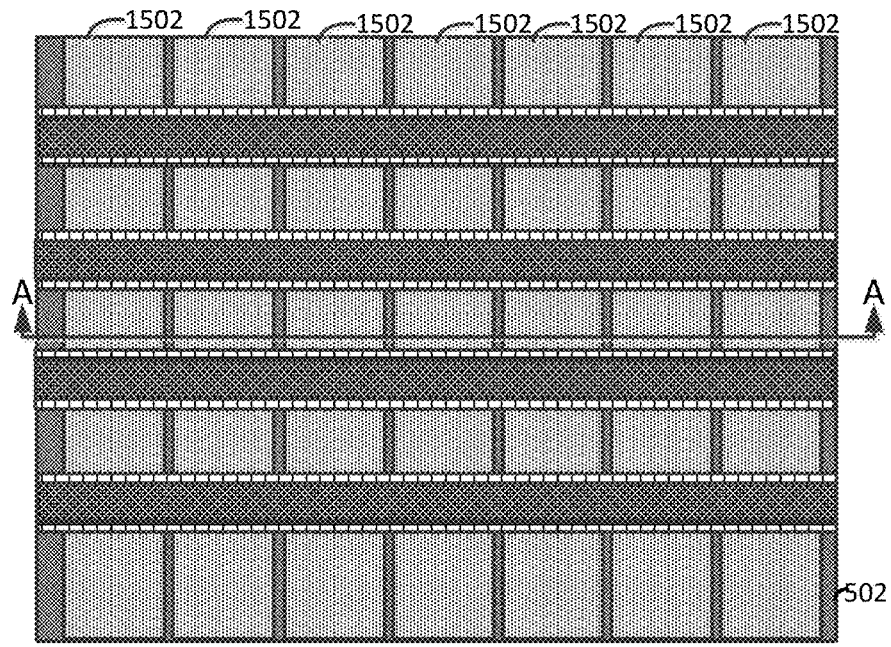

FIG. 15A illustrates a cutaway view along the line A-A of FIG. 15B following an epitaxial growth process.

FIG. 15B illustrates a top view following the epitaxial growth process.

Figure 16A:
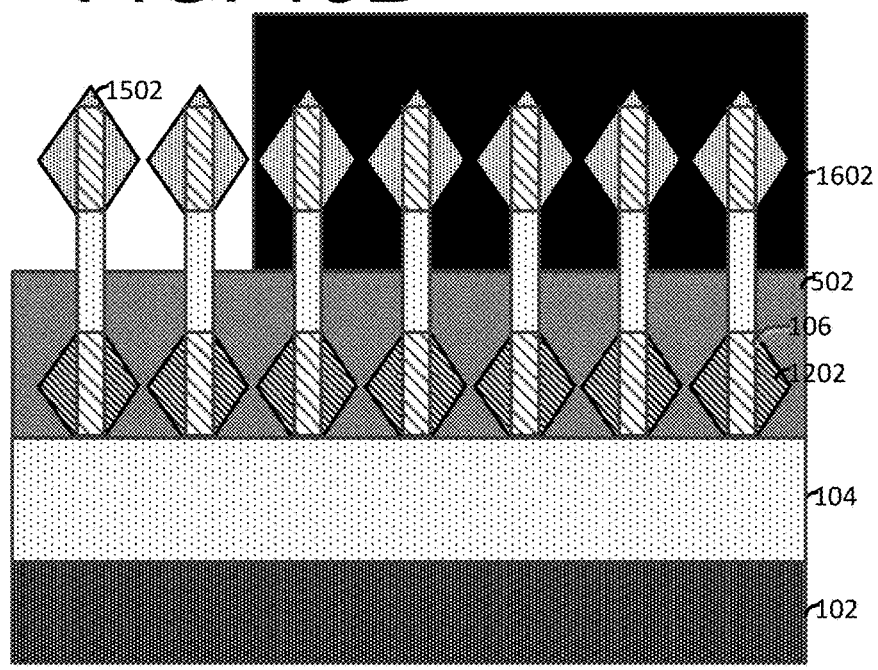
Figure 16B:
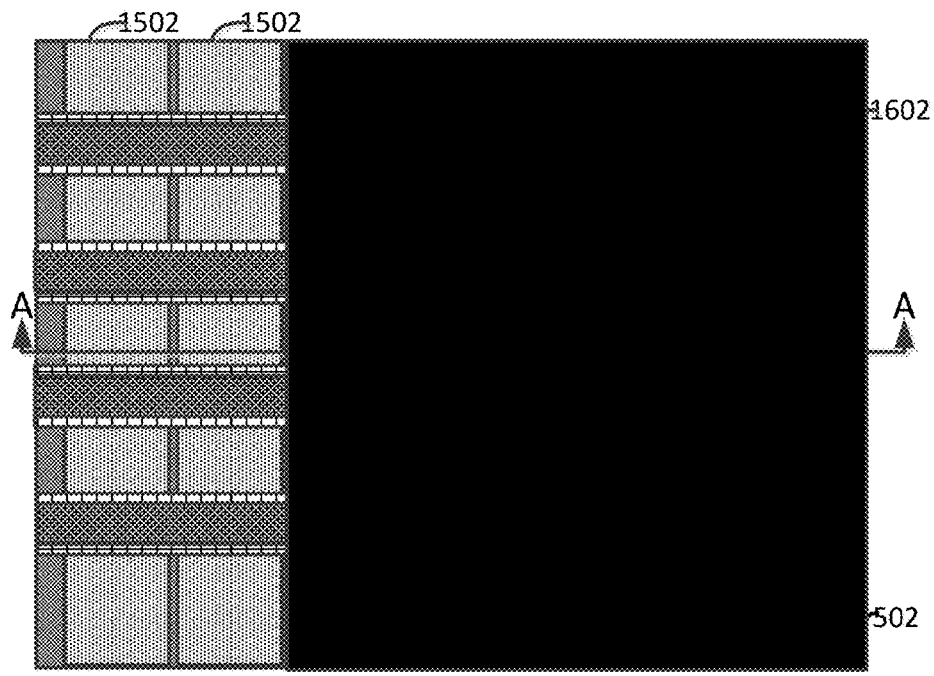

FIG. 16A illustrates a cutaway view along the line A-A of FIG. 16B following the formation of a mask.

FIG. 16B illustrates a top view of the mask.

Figure 17A:
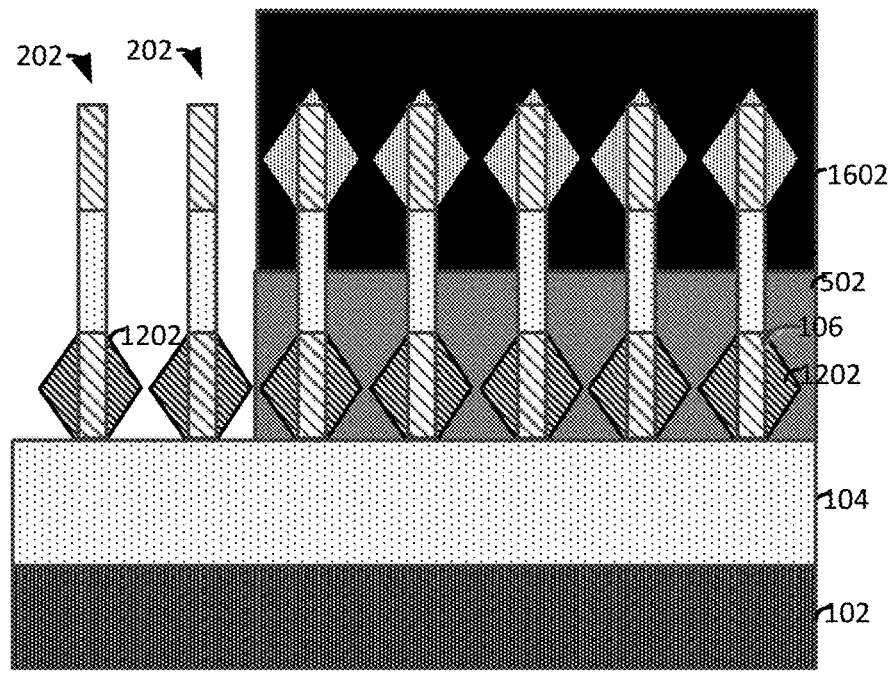
Figure 17B:
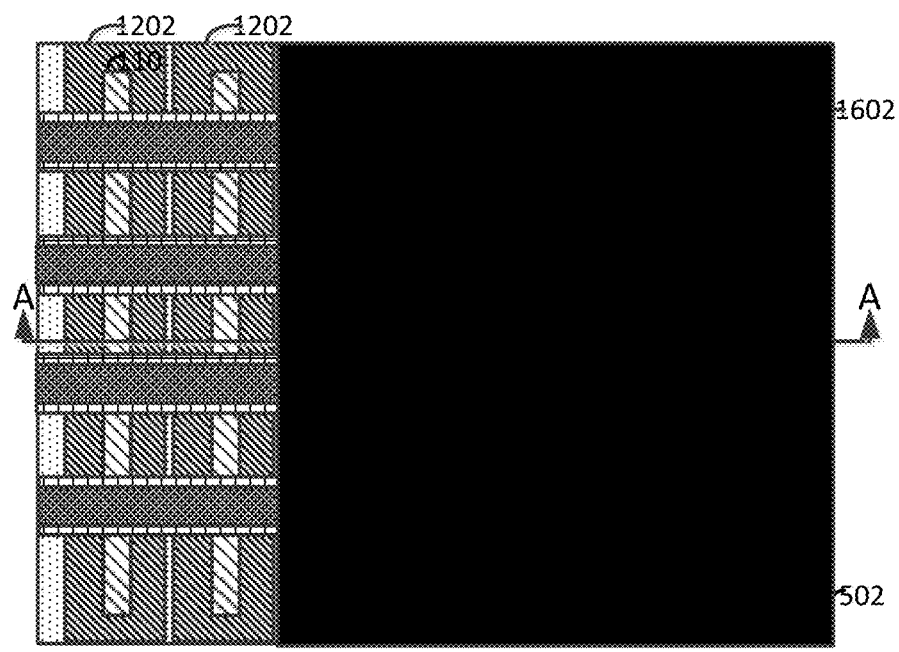

FIG. 17A illustrates a cutaway view along the line A-A of FIG. 17B following a selective etching process.

FIG. 17B illustrates a top view of the source/drain regions.

Figure 18A:
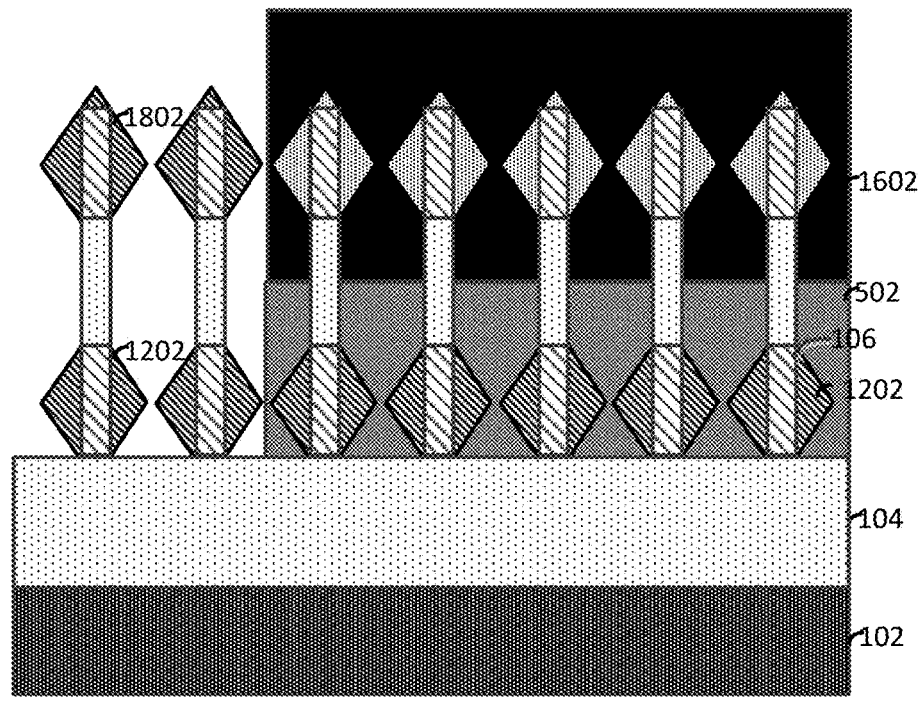
Figure 18B:
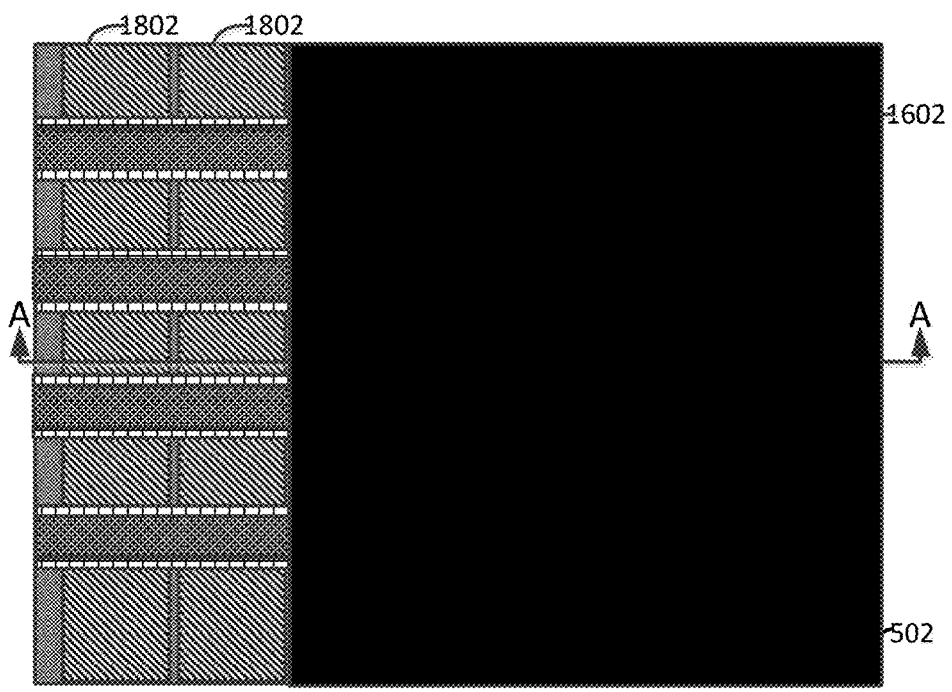

FIG. 18A illustrates a cutaway view along the line A-A of FIG. 18B following an epitaxial growth process.

FIG. 18B illustrates a top view following the formation of source/drain regions.

Figure 19A:
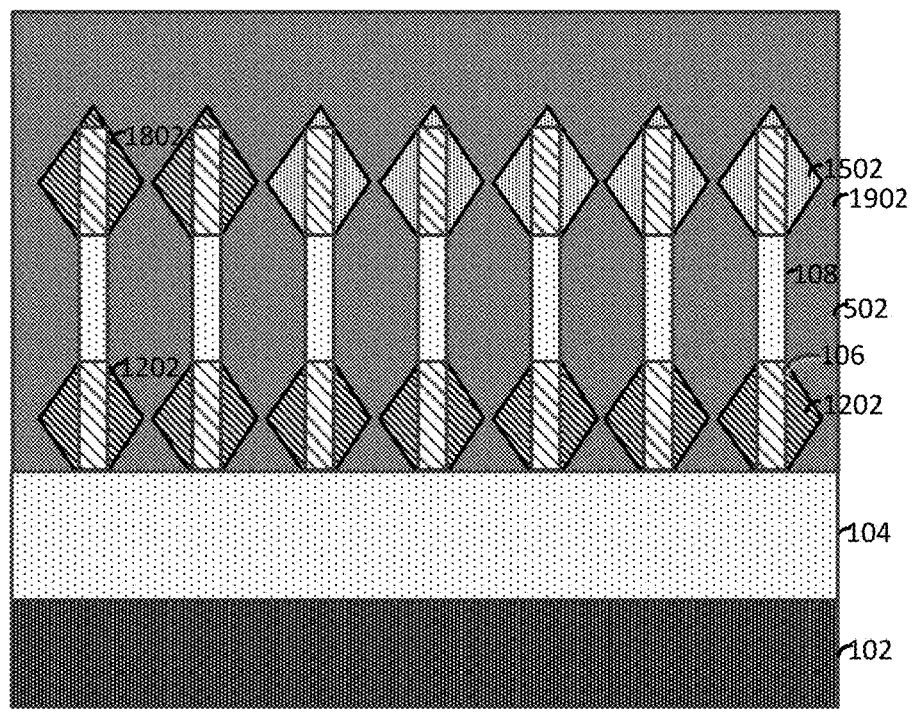
Figure 19B:
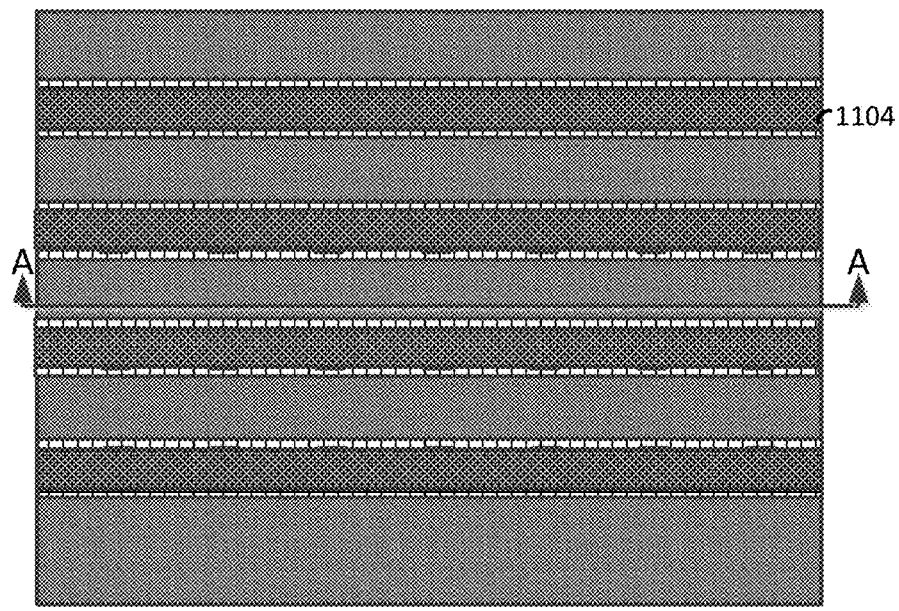

FIG. 19A illustrates a cutaway view along the line A-A of FIG. 19B following the deposition of additional ILD layer material.

FIG. 19B illustrates a top view of the ILD layer material.

Figure 20A:
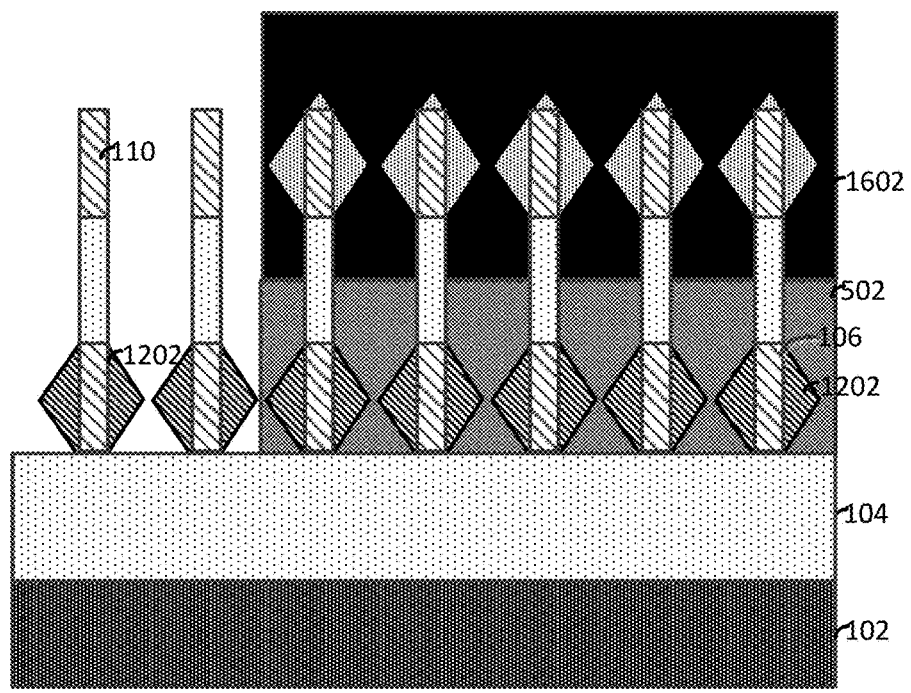
Figure 20B:
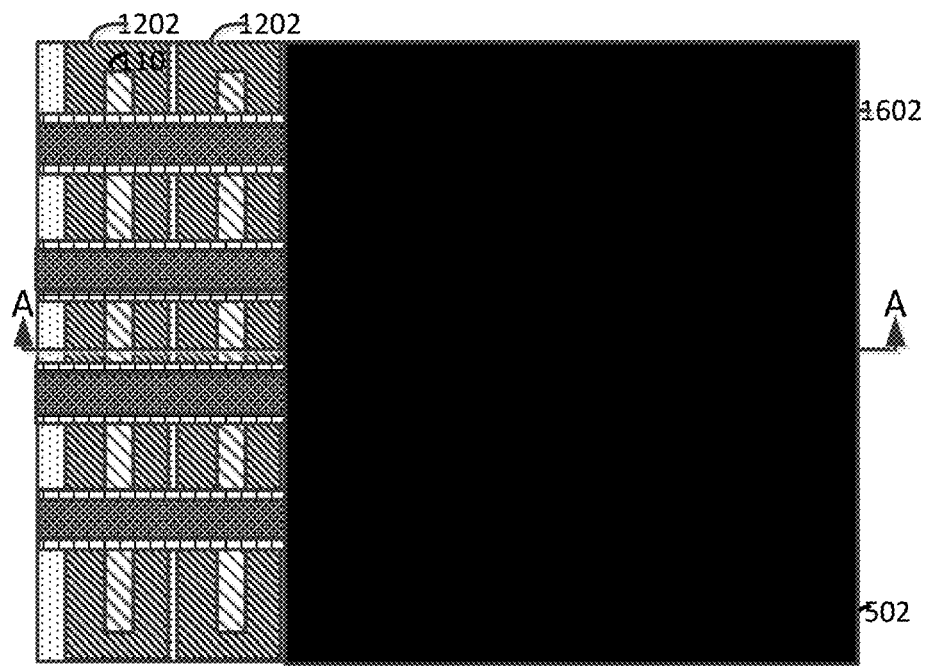

FIGS. 20A-22B illustrate an alternate exemplary method for forming FET devices:

FIG. 20A illustrates a cutaway view along the line A-A of FIG. 20B.

FIG. 20B illustrates a top view of the resultant structure following the removal of exposed source/drain regions.

Figure 21A:
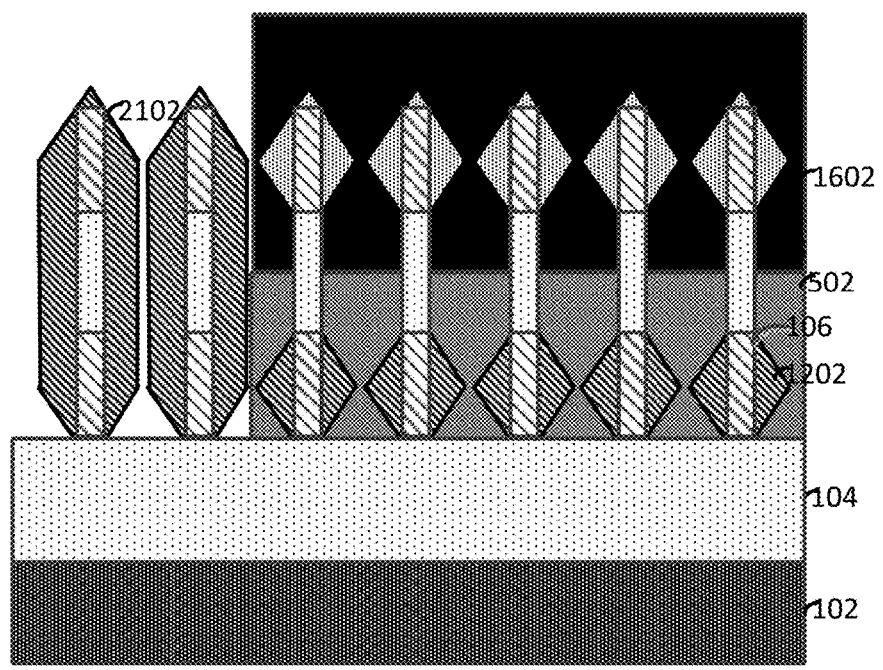
Figure 21B:
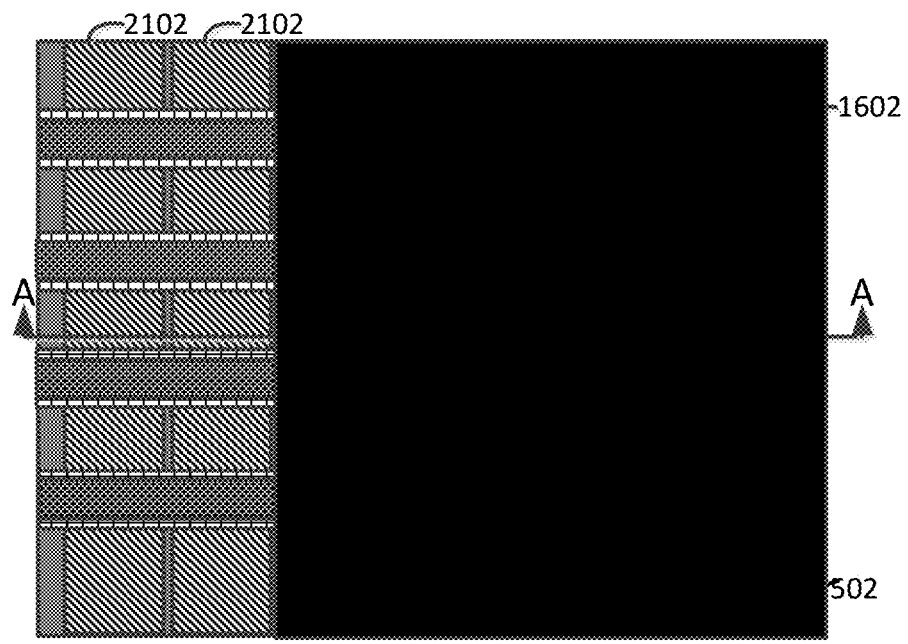

FIG. 21A illustrates a cutaway view along the line A-A of FIG. 21B following an epitaxial growth process.

FIG. 21B illustrates a top view of the source/drain regions.

Figure 22B:
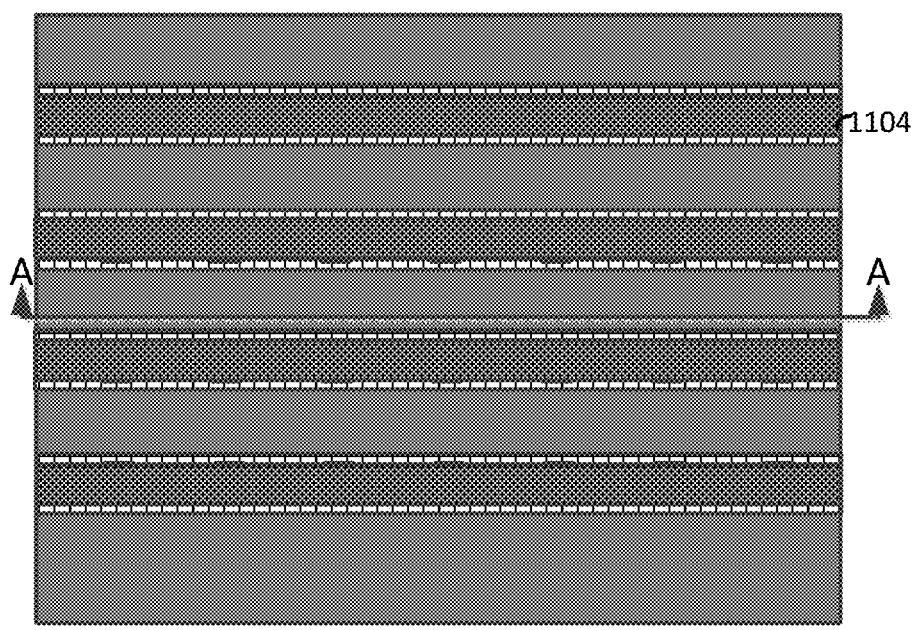

FIG. 22A illustrates a cutaway view along the line A-A of FIG. 22B following the deposition of additional ILD material.

FIG. 22B illustrates a top view following the deposition of the ILD material.

Figure 23A:
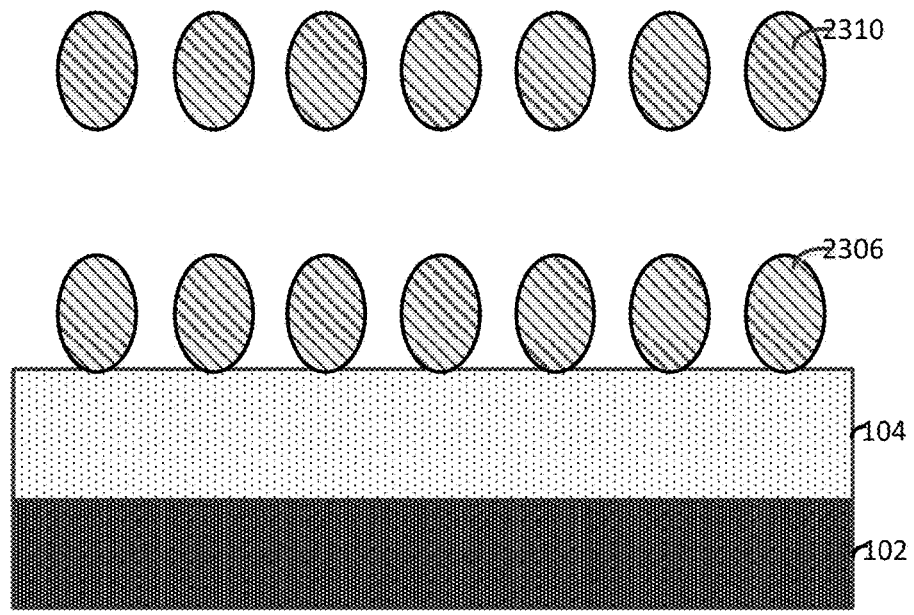
Figure 23B:
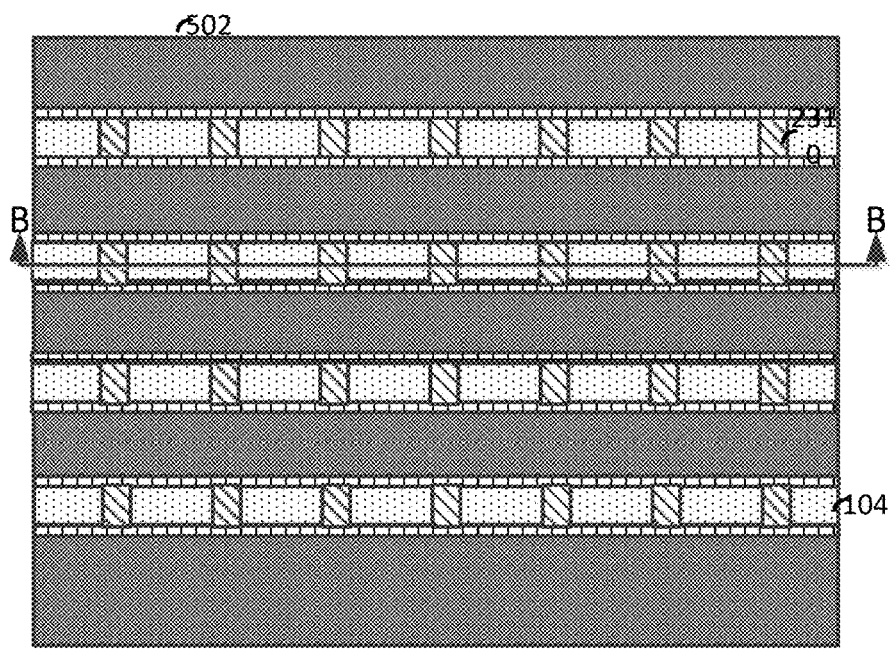

FIG. 23A illustrates a cutaway view along the line B-B of FIG. 23B following the removal of sacrificial gate stacks to expose channel regions of the fins.

FIG. 23B illustrates a top view of the nanowires.

DETAILED DESCRIPTION

Nanowire field effect transistor (FET) devices are gate all around devices that have a channel region with gate materials arranged around the nanowire channel region. FinFET devices are multi-gate devices having a fin arranged on a substrate and a gate stack arranged over a channel region of the fin. With the increased scaling demands of FET device fabrication, it is desirable to arrange stacks of nanowires or fins in a substantially coplanar arrangement. Such an arrangement reduces the footprint of the FET devices.

The embodiments described herein provide for a stacked arrangement of PFET and NFET devices having dissimilar materials in the channel regions of the devices when desired.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 1:
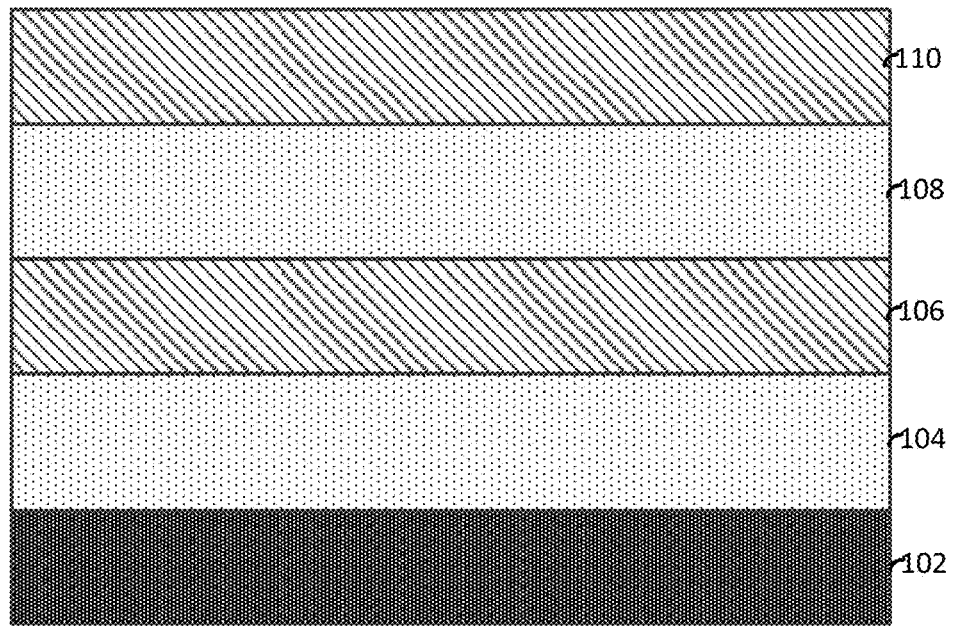

FIGS. 1-9B illustrate an exemplary method for fabricating a FET device. FIG. 1 illustrates a side view of a wafer that includes a substrate 102, a first insulator layer 104 that may include, for example a buried oxide layer, a first semiconductor layer 106 arranged on the first insulator layer 104, a second insulator layer 108 arranged on the first semiconductor layer 106, and a second semiconductor layer 110 arranged on the second insulator layer 108.

Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Figure 2A:
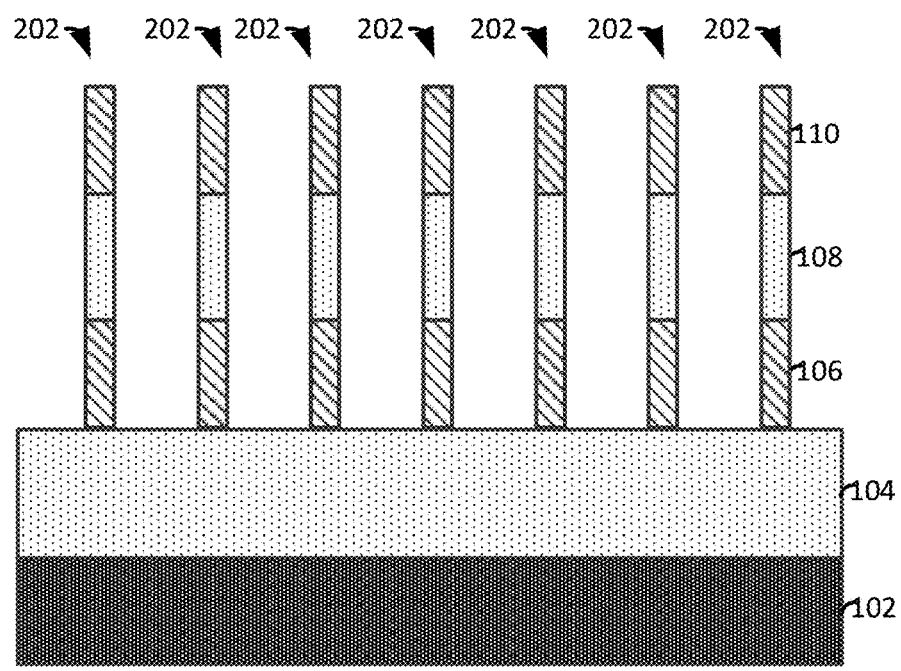
FIG. 2A illustrates a cutaway view along the line A-A of FIG. 2B following the formation of fins.
Figure 2B:
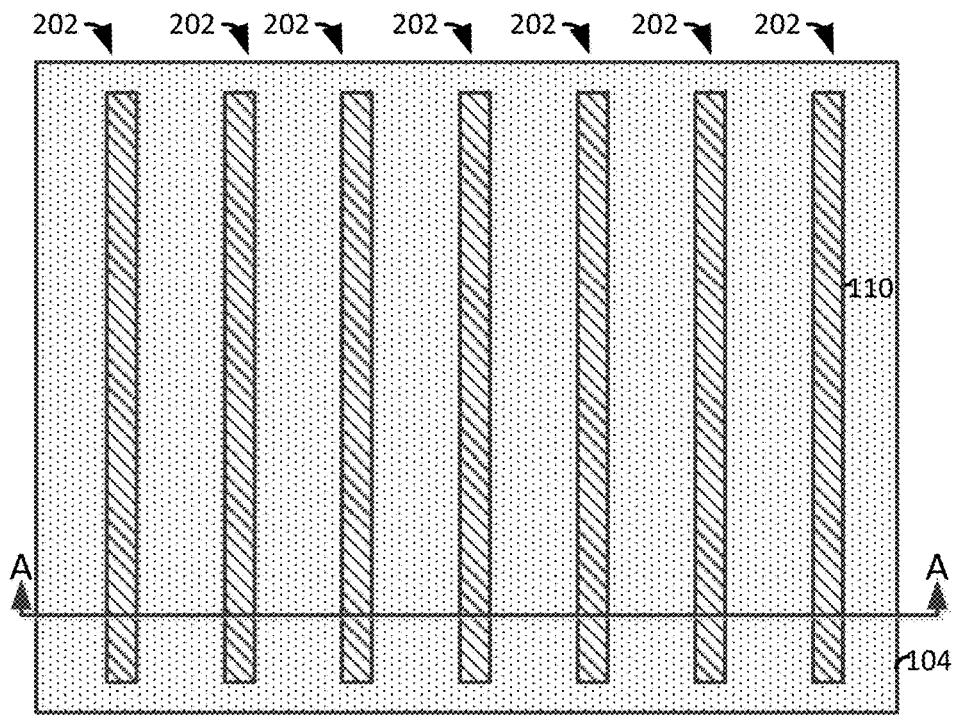
FIG. 2B illustrates a top view of the fins arranged on the first insulator layer.

FIG. 2A illustrates a cutaway view along the line A-A of FIG. 2B following the formation of fins 202. The fins 202 may be formed by any suitable process including, for example, a photolithographic patterning and etching process or a sidewall image transfer process. In the illustrated embodiment, the fins 202 are formed by an etching process such as, for example, reactive ion etching (RIE) that removes portions of the second semiconductor layer 110, the second insulating layer 108, and the first semiconductor layer 106 to expose portions of the first insulating layer 104.

FIG. 2B illustrates a top view of the fins 202 arranged on the first insulator layer 104.

Figure 3A:
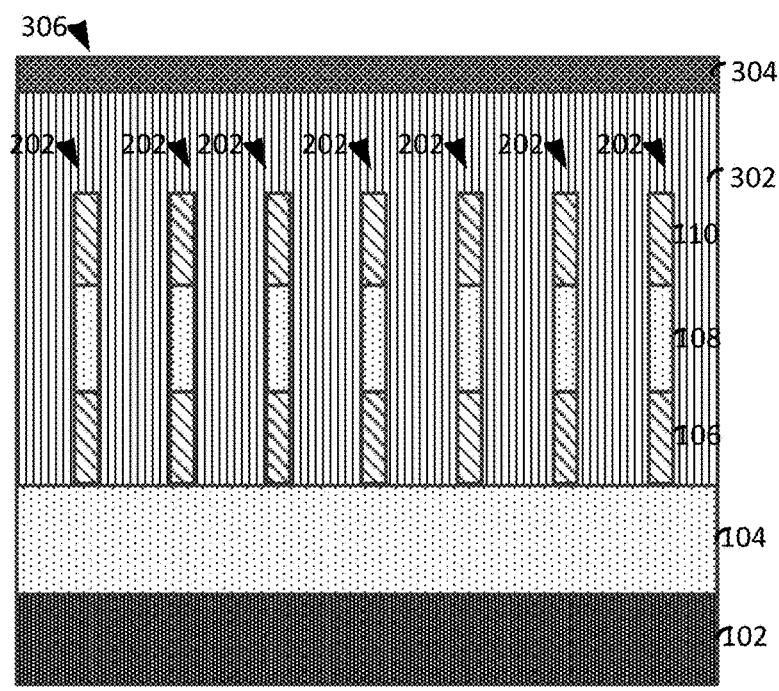
FIG. 3A illustrates a cutaway view along the line A-A of FIG. 3B following the formation of sacrificial (sacrificial) gate stacks.
Figure 3B:
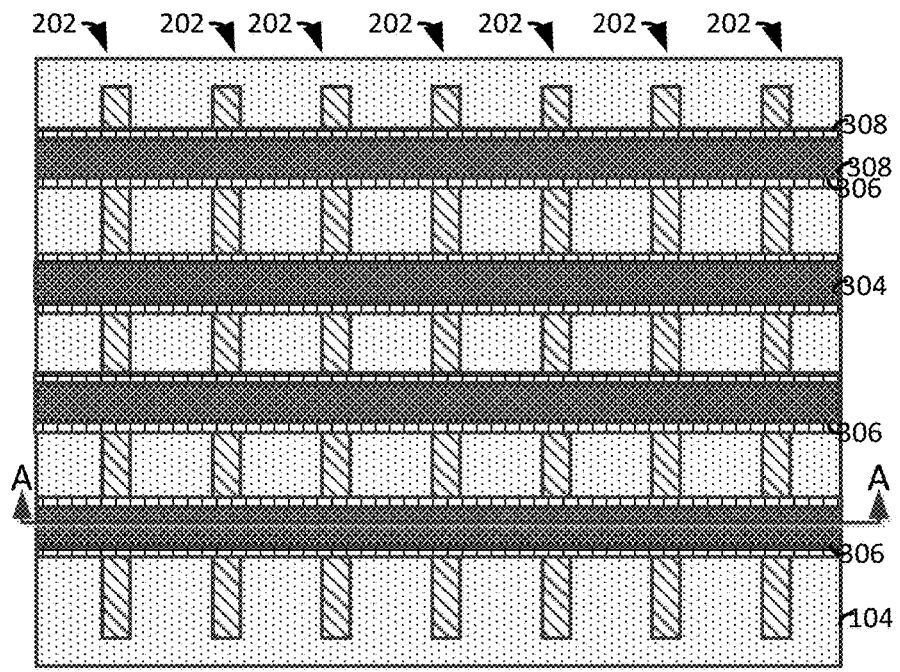
FIG. 3B illustrates a top view of the sacrificial gate stacks.

FIG. 3A illustrates a cutaway view along the line A-A of FIG. 3B following the formation of sacrificial (dummy) gate stacks 306 over portions of the fins 202. The sacrificial gate stacks 306 may be formed by, for example, depositing a layer of polysilicon 302 over the fins 202 and the first insulator layer 104. Following the deposition of the polysilicon layer 302, a hardmask layer 304 is deposited over the polysilicon layer 302. Non-limiting examples of suitable materials for the hard mask layer 304 include silicon oxide, silicon nitride, or any combination thereof. The thickness of the hard mask layer 304 is not intended to be limited. The sacrificial gate stacks 306 are formed by, for example, a photolithographic patterning and etching process such as RIE.

FIG. 3B illustrates a top view of the sacrificial gate stacks 306. Following the patterning of the sacrificial gate stacks 306, spacers 308 are formed adjacent to the sacrificial gate stacks 306. The spacers may be formed by, for example, depositing a conformal layer of oxide or nitride material over the sacrificial gate stacks 306 and performing an anisotropic etching process such as RIE that forms the spacers on the sidewalls of the sacrificial gate stacks 306.

Figure 4A:
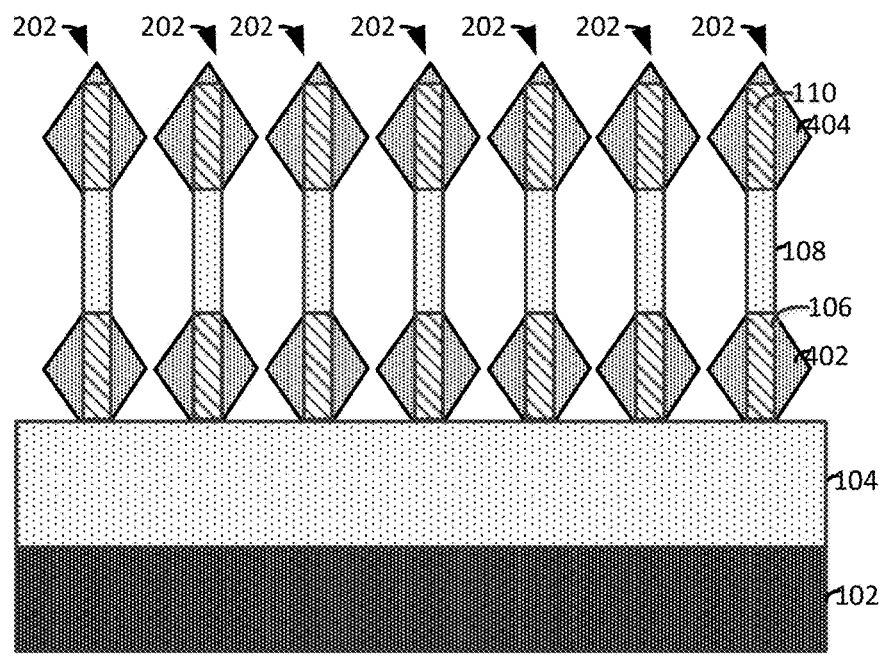
FIG. 4A illustrates a cutaway view along the line A-A of FIG. 4B following the formation of epitaxially grown source/drain regions.
Figure 4B:
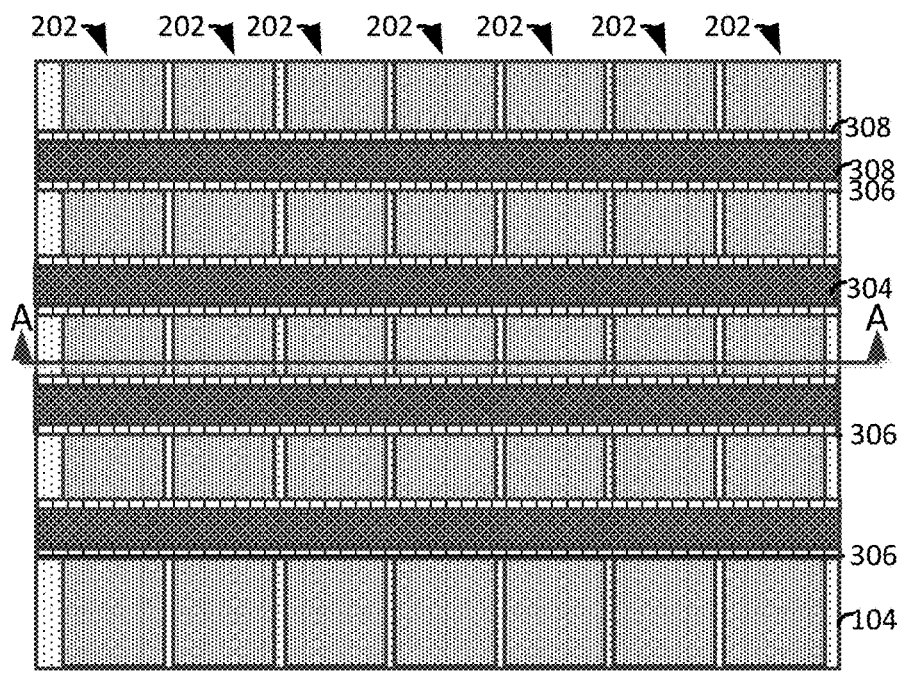
FIG. 4B illustrates a top view following the formation of the source/drain regions.

FIG. 4A illustrates a cutaway view along the line A-A of FIG. 4B following the formation of epitaxially grown source/drain regions 402 on exposed portions of the first semiconductor layer 106 of the fins 202, and the formation of epitaxially grown source/drain regions 404 on exposed portions of the second semiconductor layer 110 of the fins 202. Thus, each fin 202 has a source/drain region 404 arranged above a source/drain region 404. FIG. 4B illustrates a top view following the formation of the source/drain regions 402 and 404.

To form the source/drain regions 402 and 404, an epitaxial growth process is performed to deposit a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor.

In FIGS. 4A and 4B the source/drain regions 402 and 404 are formed in an epitaxial growth process such that the source/drain regions 402 and 404 are substantially similar with regard to the semiconductor material and dopant concentrations.

Figure 5A:
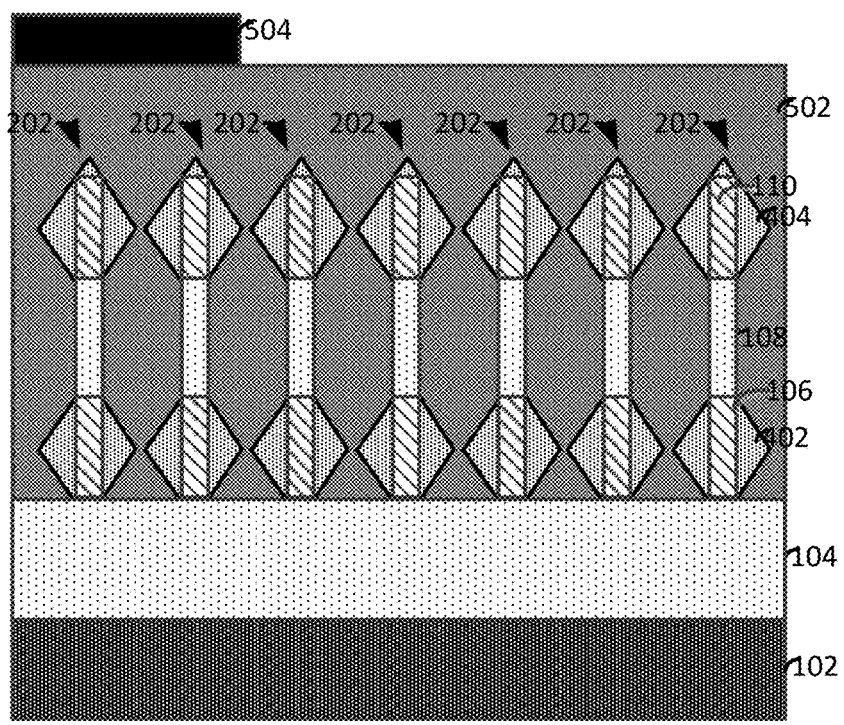
FIG. 5A illustrates a cutaway view along the line A-A of FIG. 5B following the deposition of an inter-level dielectric layer.
Figure 5B:
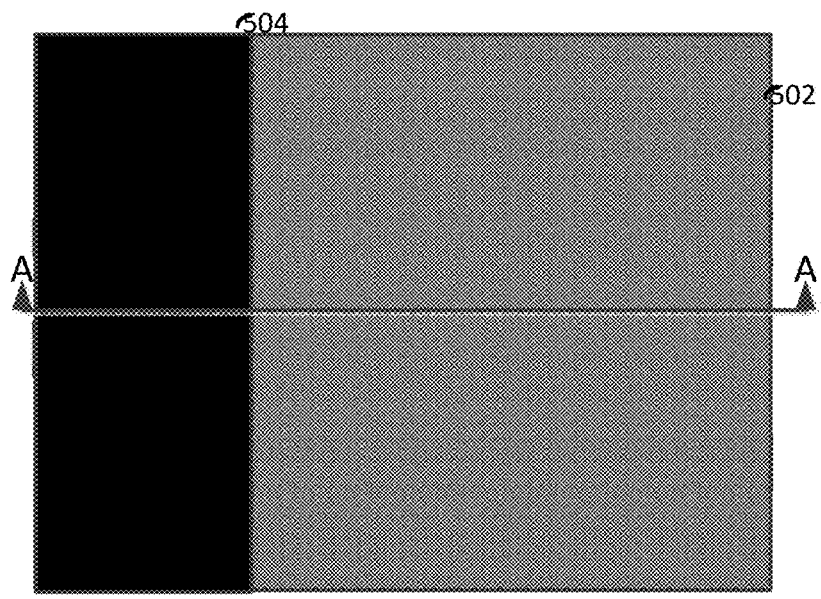
FIG. 5B illustrates a top view of the mask arranged on the ILD layer.

FIG. 5A illustrates a cutaway view along the line A-A of FIG. 5B following the deposition of an inter-level dielectric layer 502. The inter-level dielectric (ILD) layer 502 may be formed from, for example, a low-k dielectric oxide, including but not limited to, silicon dioxide, spin-on-glass, a flowable oxide, a high density plasma oxide, borophosphosilicate glass (BPSG), or any combination thereof. The ILD layer 502 may further comprise a liner (e.g., silicon nitride) (not shown) that is deposited before the oxide.

Following the formation of the ILD layer 502, a mask 504 is patterned on the ILD layer 502. In the illustrated exemplary embodiment, the mask 504 is an organic mask that is patterned over two of the fins 202. FIG. 5B illustrates a top view of the mask 504 arranged on the ILD layer 502.

Figure 6A:
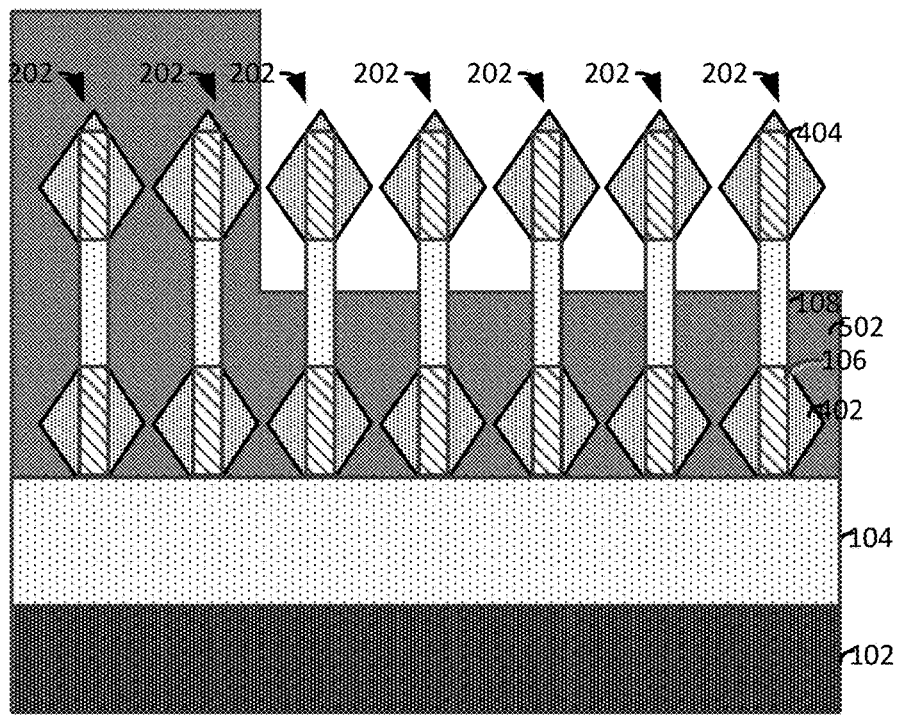
FIG. 6A illustrates a cutaway view along the line A-A of FIG. 6B following the removal of portions of the ILD layer.
Figure 6B:
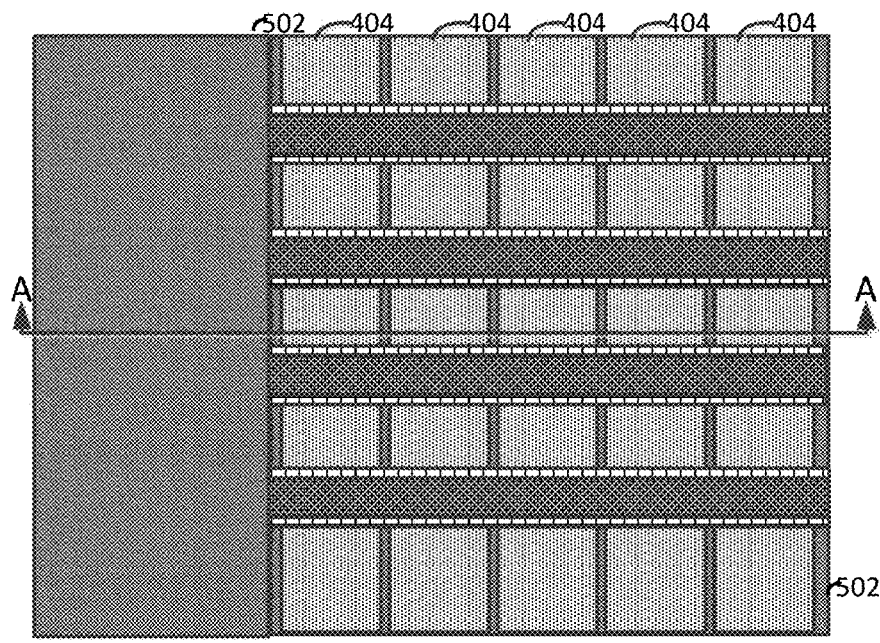
FIG. 6B illustrates a top view following the removal of portions of the ILD layer to expose some of the source/drain regions.

FIG. 6A illustrates a cutaway view along the line A-A of FIG. 6B following the removal of portions of the ILD layer 502. In this regard, a selective etching process is performed that removes exposed portions of the ILD layer 504 and exposes some of the source/drain regions 404. The etching process, may include, for example, a timed chemical etching process that removes a desired portion of the ILD layer 504.

FIG. 6B illustrates a top view following the removal of portions of the ILD layer 504 to expose some of the source/drain regions 404.

Figure 7A:
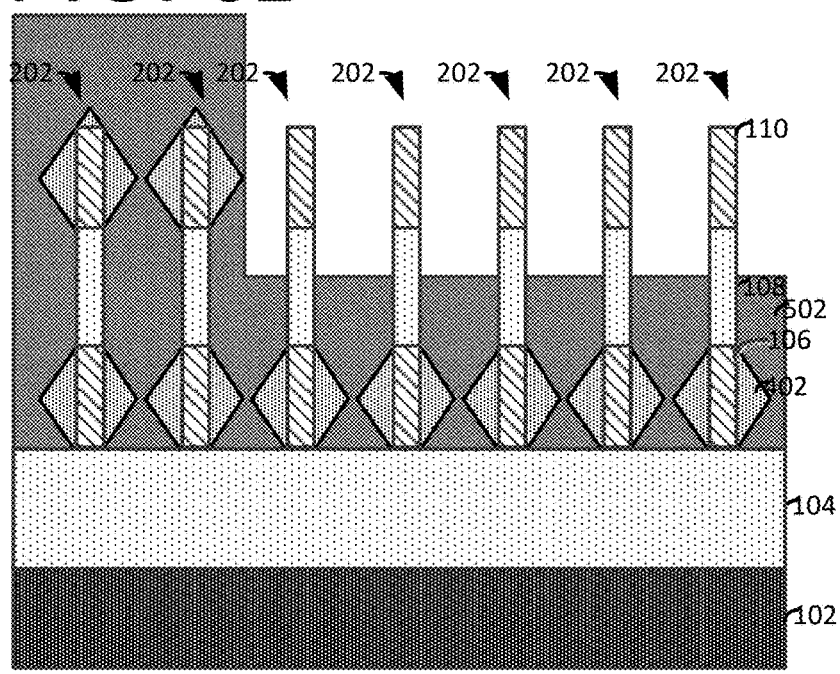
FIG. 7A illustrates a cutaway view along the line A-A of FIG. 7B following a selective etching process.
Figure 7B:
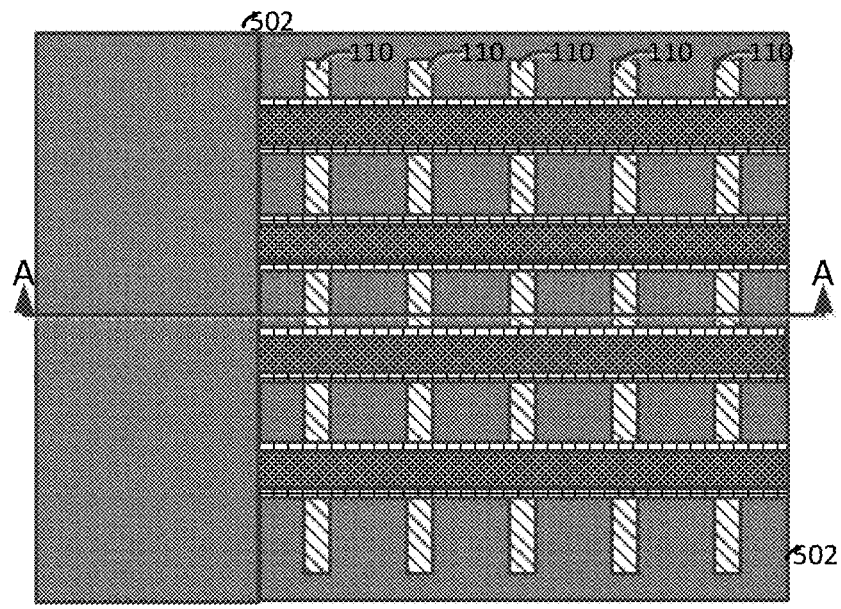
FIG. 7B illustrates a top view following the removal of exposed portions of the source/drain regions.

FIG. 7A illustrates a cutaway view along the line A-A of FIG. 7B following a selective etching process that removes exposed portions of the source/drain region 404 (of FIG. 6A), and exposes portions of the second semiconductor layer 110 of some of the fins 202. A suitable selective etching process is used to remove exposed portions of the source/drain regions 404 such as, for example, gaseous HCl etching.

FIG. 7B illustrates a top view following the removal of exposed portions of the source/drain regions 404.

Figure 8A:
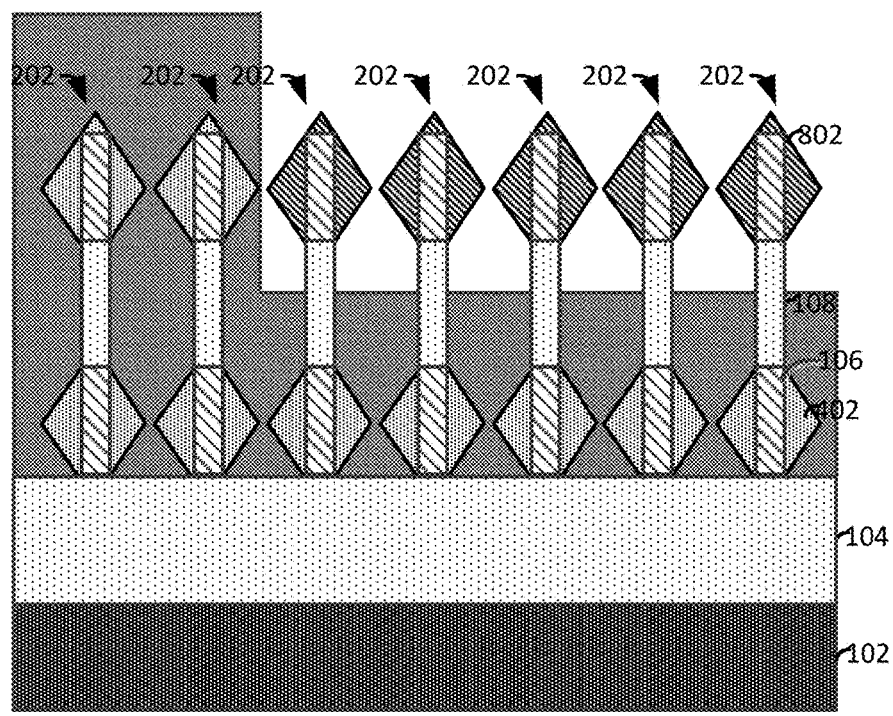
FIG. 8A illustrates a cut-away view along the line A-A of FIG. 8B following an epitaxial growth process.
Figure 8B:
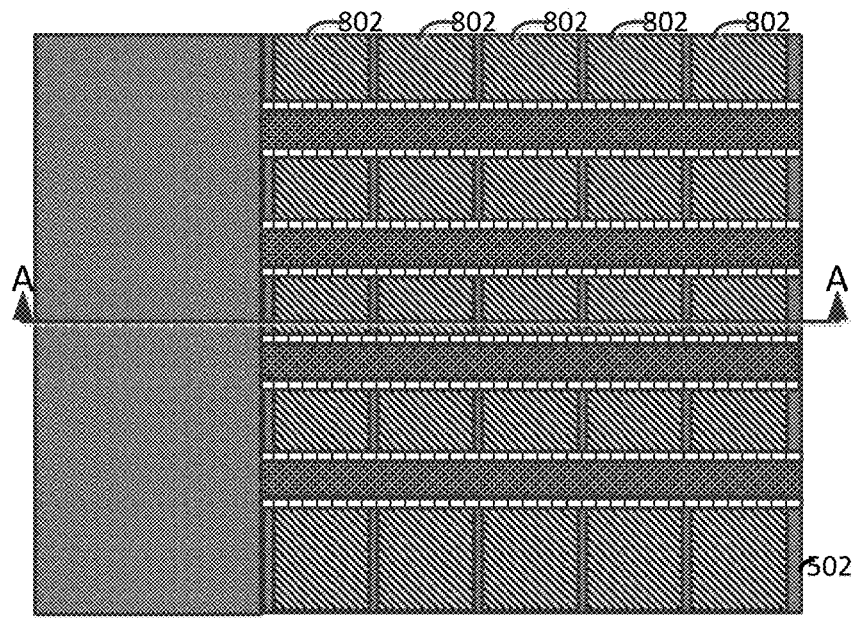
FIG. 8B illustrates a top view following the formation of the source/drain regions.

FIG. 8A illustrates a cut-away view along the line A-A of FIG. 8B following an epitaxial growth process that forms source/drain regions 802 on exposed portions of the second semiconductor layer 110 of the fins 202. In the illustrated embodiment, the source/drain regions 402 are dissimilar from the source/drain regions 802. Thus, for example, the source/drain regions 402 may be used for NFET devices and the source/drain regions 802 may be used for PFET devices. Alternatively, the source/drain regions 802 may be used for NFET devices and the source/drain regions 402 may be used for PFET devices. The source/drain regions 402 and 802 may be dissimilar in that they may comprise different types of semiconductor materials and different types of dopants and/or dopant concentrations.

FIG. 8B illustrates a top view following the formation of the source/drain regions 802.

Figure 9A:
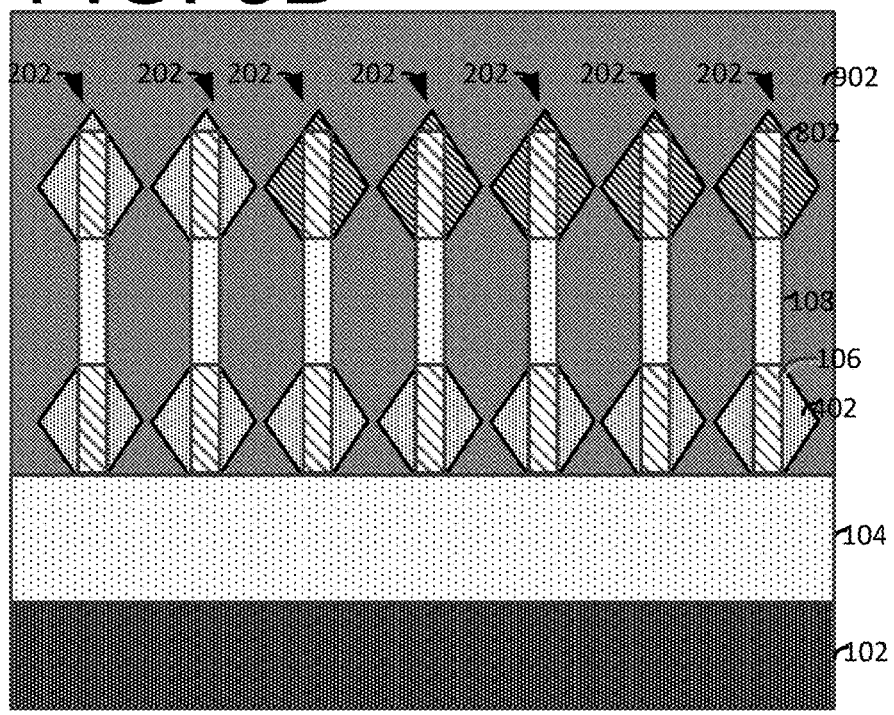
FIG. 9A illustrates a cutaway view along the line A-A of FIG. 9B following the deposition of additional IDL layer material.
Figure 9B:
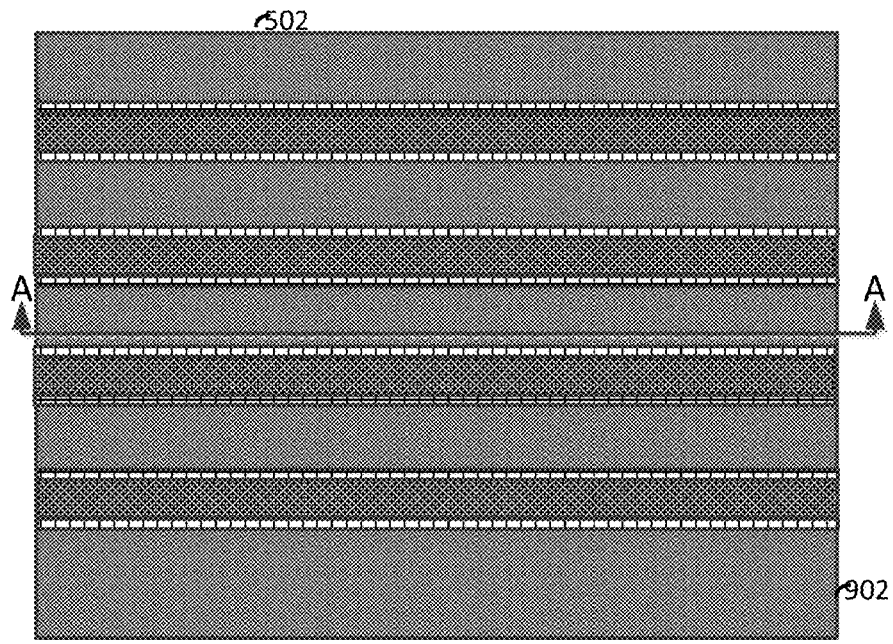

FIG. 9A illustrates a cutaway view along the line A-A of FIG. 9B following the deposition of additional IDL layer material 902 over the source/drain regions 802. FIG. 9B illustrates a top view following the deposition of the additional IDL layer material 902.

Figure 10A:
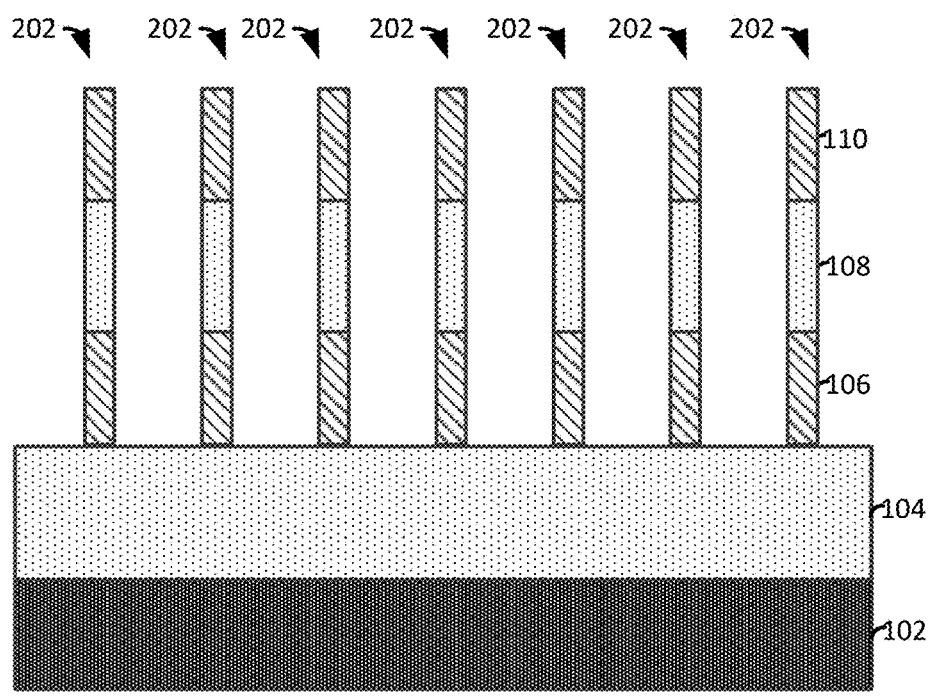
FIG. 10A illustrates a cutaway view along the line B-B of FIG. 10B following the removal of the sacrificial gates.
Figure 10B:
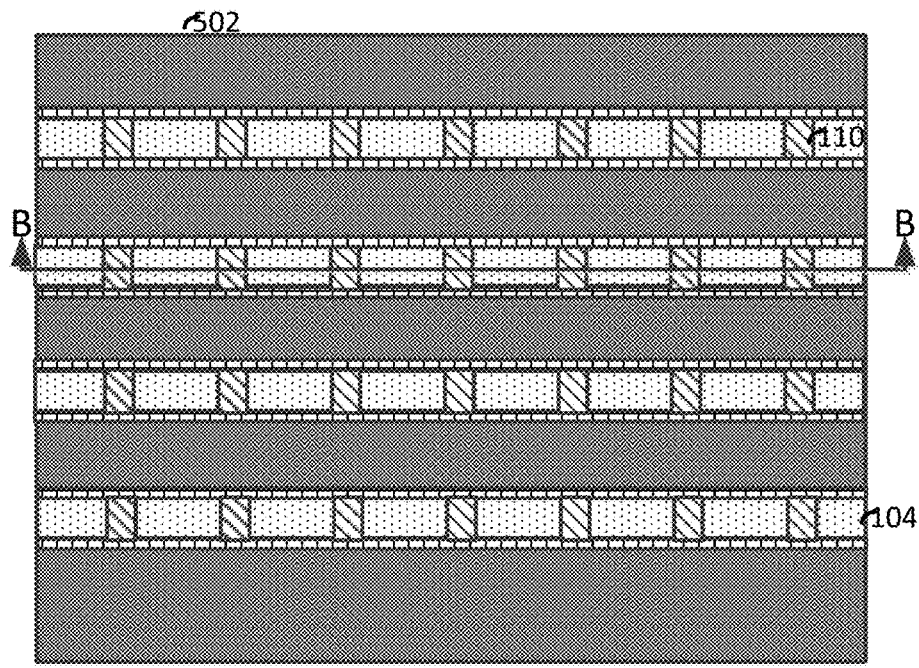
FIG. 10B illustrates a top view following the removal of the sacrificial gates.

FIG. 10A illustrates a cutaway view along the line B-B of FIG. 10B following the removal of the sacrificial gates 306 (of FIG. 9A) using a selective etching process that exposes portions of the fins 202 and the first insulator layer 104. FIG. 10B illustrates a top view following the removal of the sacrificial gates 306.

Figure 11A:
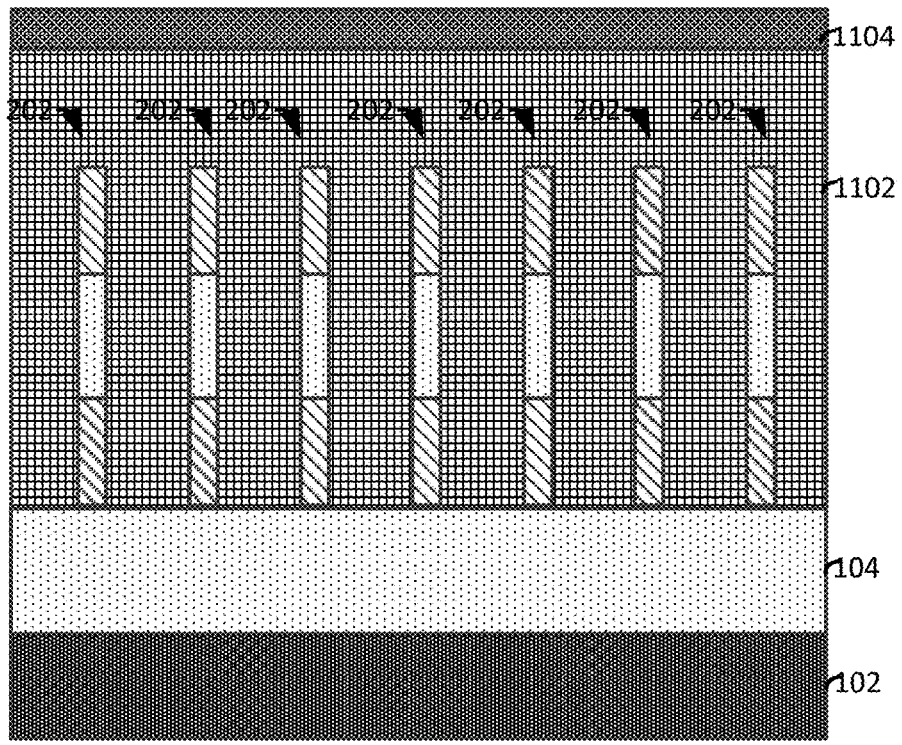
FIG. 11A illustrates a cutaway view along the line B-B of FIG. 11B following the formation of replacement metal gate stacks.
Figure 11B:
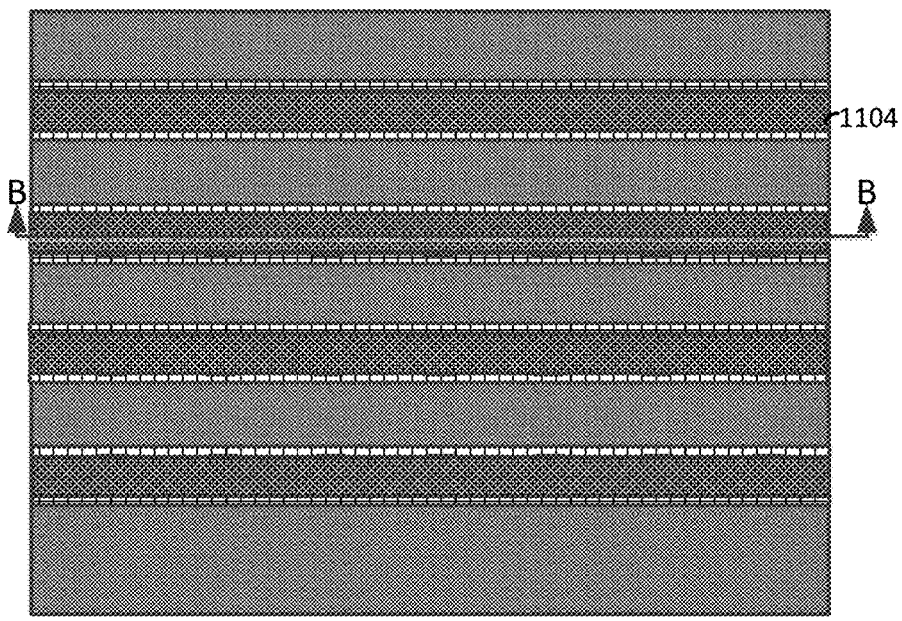
FIG. 11B illustrates a top view of the replacement metal gate stacks.

FIG. 11A illustrates a cutaway view along the line B-B of FIG. 11B following the formation of replacement metal gate stacks 1102 over the channel regions of the fins 202. FIG. 11B illustrates a top view of the replacement metal gate stacks 1102. In this regard, the gate stack 1102 includes high-k metal gates formed, for example, by filling a sacrificial gate opening (not shown) with one or more high-k dielectric materials, one or more work function metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the NFET 101 and the PFET 102. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and work function layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

Figure 12A:
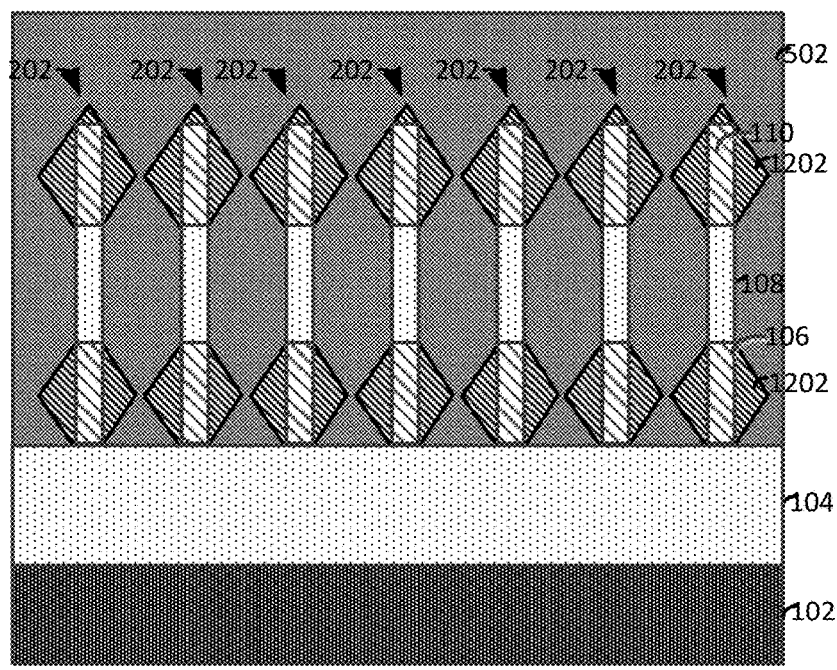
Figure 12B:
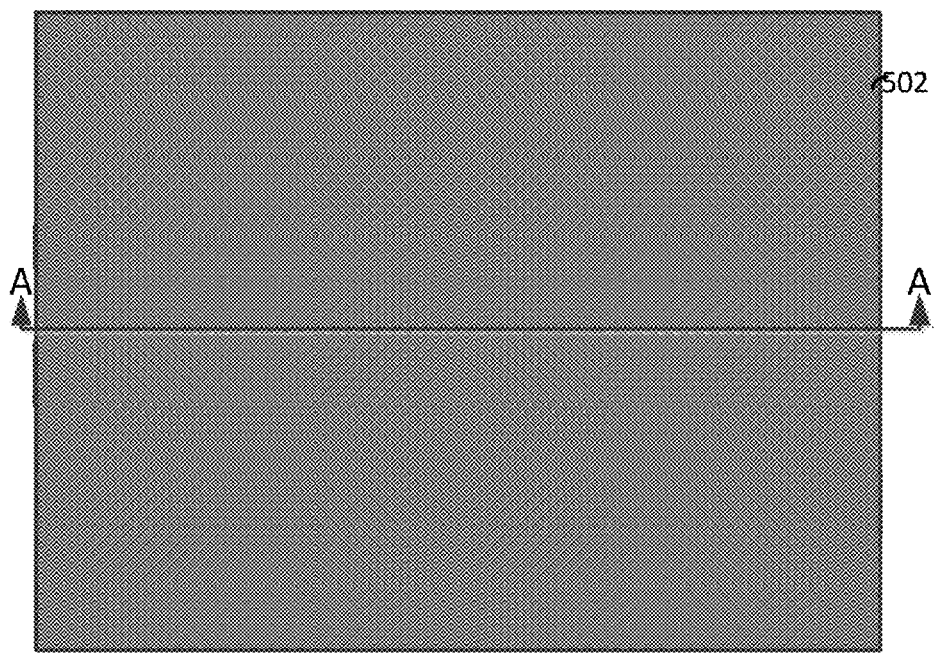
FIG. 12B illustrates a top view of the ILD layer arranged over sacrificial gate stacks.

FIGS. 12A-19B illustrate an alternate exemplary method for fabricating FET devices having stacked source/drain regions. FIG. 12A illustrates a cutaway view along the line A-A of FIG. 12B. FIG. 12A is similar to FIG. 5A discussed above and includes a number of fins 202 with stacked source/drain regions 1202 and 1204, which are formed in an epitaxial growth process such that the source/drain regions 1202 and 1204 have similar materials and dopant concentrations. FIG. 12B illustrates a top view of the ILD layer 502 arranged over sacrificial gate stacks 306 (not shown) and the source/drain regions 1202 and 1204.

Figure 13A:
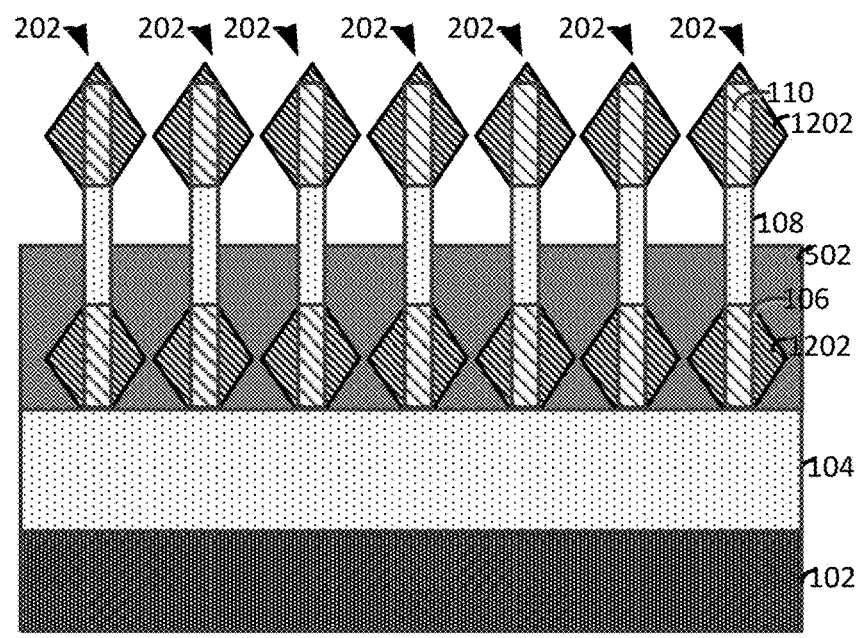
FIG. 13A illustrates a cutaway view along the line A-A of FIG. 13B of the resultant structure following a selective etching process.
Figure 13B:
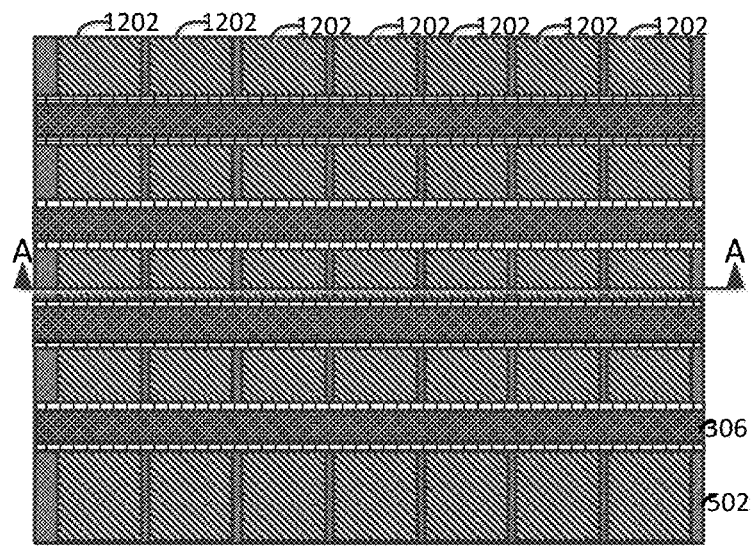

FIG. 13A illustrates a cutaway view along the line A-A of FIG. 13B of the resultant structure following a selective etching process that removes portions of the ILD layer 502 to expose the source/drain regions 1202 that are arranged on the second semiconductor layer 110 of the fins 202. FIG. 13B illustrates a top view of the exposed source/drain regions 1202 and the sacrificial gate stacks 306.

FIG. 14A illustrates a cutaway view along the line A-A of FIG. 14B following a selective etching process that removes the exposed source/drain regions 1202 and exposes portions of the second semiconductor layer 110 of the fins 202. FIG. 14B illustrates a top view of the exposed portions of the fins 202.

FIG. 15A illustrates a cutaway view along the line A-A of FIG. 15B following an epitaxial growth process that forms the source/drain regions 1502 on exposed portions of the second semiconductor layer 110 of the fins 202. In the illustrated embodiment, the source/drain regions 1502 are formed from a different semiconductor material and/or a different type of dopants and/or concentration of dopants than the source/drain regions 1202. FIG. 15B illustrates a top view following the epitaxial growth process.

FIG. 16A illustrates a cutaway view along the line A-A of FIG. 16B following the formation of a mask 1602 over some of the source/drain regions 1502. FIG. 16B illustrates a top view of the mask 1602.

FIG. 17A illustrates a cutaway view along the line A-A of FIG. 17B following a selective etching process that removes exposed source/drain regions 1502 (of FIG. 16A) to expose portions of the second semiconductor layer 110 of the fins 202. Following the removal of the exposed source/drain regions 1502 exposed portions of the ILD layer 502 may be removed by an etching process that exposes portions of the first insulator layer 104 and some of the source/drain regions 1202. FIG. 17B illustrates a top view of the source/drain regions 1202.

FIG. 18A illustrates a cutaway view along the line A-A of FIG. 18B following an epitaxial growth process that forms source/drain regions 1802 on exposed portions of the second semiconductor layer 110 of the fins 202. In the illustrated embodiment, the source/drain regions are formed from an epitaxially grown material that is similar to the material of the source/drain regions 1202 and may include a similar or dissimilar type of dopants and/or dopant concentration as the source/drain regions 1202. FIG. 18B illustrates a top view following the formation of source/drain regions 1802.

FIG. 19A illustrates a cutaway view along the line A-A of FIG. 19B following the deposition of additional ILD layer material 1902 over the ILD layer 502, the fins 202 and the source/drain regions 1802 and 1502. FIG. 19B illustrates a top view of the ILD layer material 1902 and the replacement metal gate stacks including a gate cap layer 1104 that are formed by removing the sacrificial gate stacks 306 and forming metal gate stacks in a similar manner as described above.

FIGS. 20A-22B illustrate an alternate exemplary method for forming FET devices. FIG. 20A illustrates a cutaway view along the line A-A of FIG. 20B. FIG. 20A is similar to FIG. 17A described above following the removal of the exposed source/drain regions 1502 (of FIG. 15A) and portions of the ILD layer 502 to expose some of the source/drain regions 1202, the second semiconductor layer 110 and portions of the first insulator layer 104. FIG. 20B illustrates a top view of the resultant structure following the removal of exposed source/drain regions 1502 (of FIG. 15).

FIG. 21A illustrates a cutaway view along the line A-A of FIG. 21B following an epitaxial growth process that grows epitaxial semiconductor material on exposed portions of the source/drain regions 1202 and the second semiconductor layer 110 to form source/drain regions 2102 that effectively electrically merge the exposed first semiconductor layer 106 and the exposed second semiconductor layer 110. FIG. 21B illustrates a top view of the source/drain regions 2102.

FIG. 22B illustrates a top view following the deposition of the ILD material 1902, the removal of sacrificial gate stacks, and the formation of replacement metal gates that are capped with a capping layer 1104 as discussed above.

Though the illustrated embodiments described above include an arrangement of finFET devices, similar fabrication methods may be used to form nanowire devices. In this regard, FIG. 23A illustrates a cutaway view along the line B-B of FIG. 23B following the removal of sacrificial gate stacks to expose channel regions of the fins 202. FIG. 23A is similar to FIG. 10A described above, however following the removal of the sacrificial gates, the channel regions of the fins 202 are shaped into nanowires 2306 and 2310 and the second insulator layer 108 is removed. The nanowires 2306 and 2310 may be formed by, for example, an ion implantation and oxidation process or other suitable nanowire fabrication processes. In some embodiments, the insulator layer 104 may be recessed to provide clearance for the formation of a gate stack around all or a portion of the nanowires 2306 and 2310. FIG. 23B illustrates a top view of the nanowires 2310. Following the formation of the nanowires 2306 and 2310, replacement metal gate stacks may be formed by any suitable process or as described above.

The method for forming the nanowires 2306 and 2310 may be used in any of the embodiments described above following the removal of the sacrificial gate stacks and prior to the formation of the replacement metal gate stacks.

Though the exemplary embodiments described above show fins having two layers of semiconductor materials that result in two stacked source/drain regions, alternate embodiments may include any number of layers of semiconductor materials interspaced by insulator layers that may be used to form any number of stacked source/drain regions having dissimilar epitaxially grown material and/or dopants and/or dopant concentrations.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device comprising:
   a first epitaxially grown source/drain region comprising a first material arranged on a first fin;
   a second epitaxially grown source/drain region comprising the first material arranged on the first fin, the second epitaxially grown source/drain region arranged above the first epitaxially grown source/drain region;
   a third epitaxially grown source/drain region comprising the first material arranged on a second fin;
   a fourth epitaxially grown source/drain region comprising a second material arranged on the second fin, the fourth epitaxially grown source/drain region arranged above the third epitaxially grown source/drain region; and
   a gate stack arranged over a channel region of the first fin and a channel region of the second fin.

2. The device of claim 1, wherein the first material includes n-type dopants and the second material includes p-type dopants.

3. The device of claim 1, wherein the first fin includes:
   a first semiconductor region;
   an insulator region arranged on the first semiconductor region; and
   a second semiconductor region arranged on the insulator region.

4. The device of claim 1, wherein the second fin includes:
   a first semiconductor region;
   an insulator region arranged on the first semiconductor region; and
   a second semiconductor region arranged on the insulator region.

5. The device of claim 3, wherein the first epitaxially grown source/drain region is arranged on the first semiconductor region of the first fin and the second epitaxially grown source/drain region is arranged on the second semiconductor region of the first fin.

6. The device of claim 4, wherein the third epitaxially grown source/drain region is arranged on the first semiconductor region of the second fin and the fourth epitaxially grown source/drain region is arranged on the second semiconductor region of the second fin.

7. The device of claim 1 wherein the first material is dissimilar from second material.

* * * * *